US006862127B1

(12) United States Patent
Ishii

(10) Patent No.: US 6,862,127 B1
(45) Date of Patent: Mar. 1, 2005

(54) HIGH PERFORMANCE MICROMIRROR ARRAYS AND METHODS OF MANUFACTURING THE SAME

(76) Inventor: Fusao Ishii, 350 Sharon Park Dr., G26, Menlo Park, CA (US) 94024

( * ) Notice: Subject to any disclaimer, the term of this patent is extended or adjusted under 35 U.S.C. 154(b) by 0 days.

(21) Appl. No.: 10/699,140

(22) Filed: Nov. 1, 2003

(51) Int. Cl.[7] .................. G02B 26/00; G02B 26/08; H01L 21/50
(52) U.S. Cl. .................. 359/291; 359/290; 359/223; 438/114; 438/115
(58) Field of Search .................. 359/291, 290, 359/292, 295, 223, 224; 438/114, 115, 116

(56) References Cited

U.S. PATENT DOCUMENTS

| 4,229,732 A | 10/1980 | Hartstein et al. ........... 362/297 |
| 4,592,628 A | 6/1986 | Altman et al. ............. 359/223 |
| 4,662,746 A | 5/1987 | Hornbeck .................. 359/223 |
| 5,216,537 A | 6/1993 | Hornbeck .................... 438/23 |
| 5,583,688 A | 12/1996 | Hornbeck .................. 359/291 |
| 5,631,782 A | 5/1997 | Smith et al. ................ 359/871 |
| 5,835,256 A | 11/1998 | Huibers ..................... 359/291 |
| 6,344,672 B2 | 2/2002 | Huffman .................... 257/296 |
| 6,469,821 B2 | 10/2002 | Bartlett et al. ............. 359/292 |
| 6,523,961 B2 | 2/2003 | Ilkov et al. .................. 353/99 |
| 6,529,310 B1 | 3/2003 | Huibers et al. ............. 359/291 |
| 6,538,800 B2 | 3/2003 | Huibers ...................... 359/291 |
| 2003/0134449 A1 | 7/2003 | Huibers ........................ 353/99 |

OTHER PUBLICATIONS

D. Scott Dewald, et al., "Advances in contrast enhancement for DLP projection displays," Journal of the SID, 2003, pp. 177–181, vol. 11, No. 1, Society for Information Display, San Jose, California, USA.

Primary Examiner—Timothy Thompson

(57) ABSTRACT

A 1 dimensional or 2 dimensional array of micromirror devices comprises a device substrate with a 1st surface and a 2nd surface, control circuitry disposed on said 1st surface and a plurality of micromirrors disposed on said 2nd surface. Each micromirror comprises a reflective surface that is substantially optically flat, with neither recesses nor protrusions. Such a 1 dimensional or 2 dimensional array of micromirror devices may be used as a spatial light modulator (SLM). Methods of fabricating arrays of micromirror devices are also disclosed. Such methods generally involve providing a device substrate with a 1st surface and a 2nd surface, fabricating control circuitry on the 1st surface, and fabricating micromirrors on the 2nd surface, such that the reflective surfaces of the micromirrors are substantially optically flat, with neither recesses nor protrusions.

48 Claims, 13 Drawing Sheets

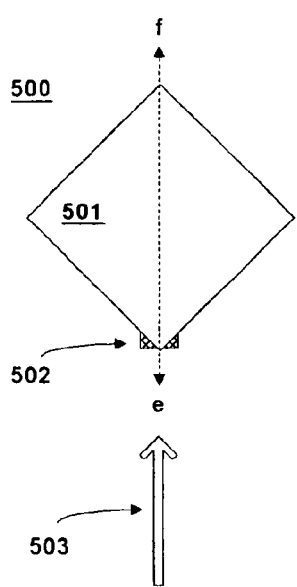
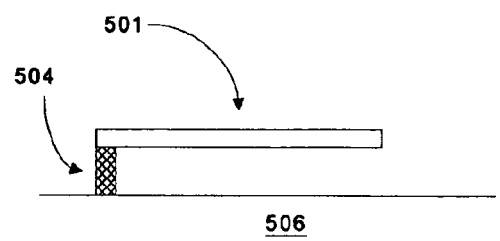
Fig. 5A
Fig. 5B

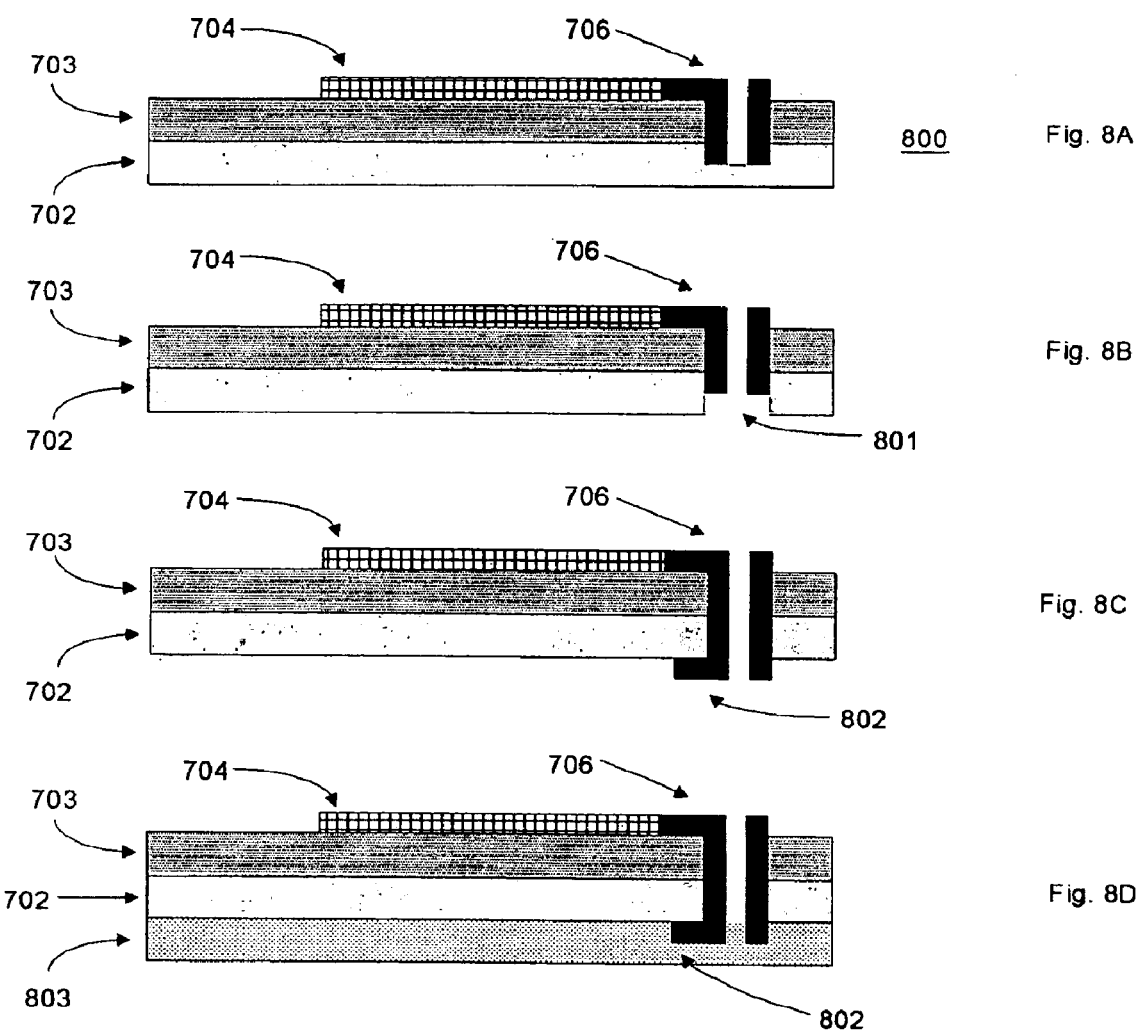

US 6,862,127 B1

HIGH PERFORMANCE MICROMIRROR ARRAYS AND METHODS OF MANUFACTURING THE SAME

TECHNICAL FIELD

This invention relates to arrays of electromechanical micromirror devices and methods of manufacturing the same. Such arrays have applications in spatial light modulators.

BACKGROUND ART

Electromechanical micromirror devices have drawn considerable interest because of their application as spatial light modulators (SLMs). A spatial light modulator requires an array of a relatively large number of such micromirror devices. In general, the number of devices required ranges from 60,000 to several million for each SLM. Despite significant advances that have been made in recent years, there is still a need for improvement in the performance and manufacturing yields of electromechanical micromirror devices.

An example of an early generation prior art device is disclosed in U.S. Pat. No. 4,592,628. U.S. Pat. No. 4,592,628 describes an array of light reflecting devices on a substrate. Each device comprises a hollow post and a deflectable polygonal mirror attached thereto. Each mirror acts as a deflectable cantilever beam. The mirrors are deflected by a beam of electrons from a cathode ray tube. The hollow posts act as scattering and diffraction sites. Since the mirror is the deflectable cantilever beam, the mirror will not be flat when deflected. As a result, the light throughput of the mirror into a certain acceptance cone is not as good as if the mirror were optically flat. Preferred mirror shapes include squares, rectangles, and hexagons.

Another early generation device is disclosed in U.S. Pat. No. 4,229,732. In this case, addressing circuits using MOSFETs were fabricated on the surface of the substrate. Deflectable metallic mirrors were also fabricated on the surface of the substrate. The metallic mirrors are not flat when deflected. As a result, the light throughput into a certain acceptance cone is not as good as if the mirror were optically flat. Since the MOSFET circuits and mirrors could not overlap, the fill factor of the array was not as high as if the mirrors could cover the entire surface area.

A 1st generation Texas Instruments, Inc. (TI) device is described in U.S. Pat. No. 4,662,746. A micromirror is suspended by 1 or 2 hinges. If suspended by 1 hinge, the micromirror deflects like a cantilever beam. If suspended by 2 hinges, the micromirror deflects like a torsion beam. Addressing electrodes are located below the micromirrors and addressing circuits are located at the same level in the substrate as the addressing electrodes. This means that the fill factor is improved. FIG. 1a of this patent shows a perspective view of a micromirror. The micromirror has plasma etch access holes that are used for plasma etching the underlying sacrificial layer. These plasma etch access holes lower the fill factor and increase scattering and diffraction. Note that the hinge metal layer has a substantially smaller thickness than the beam metal layer. This means that most of the bending occurs at the hinge and not at the beam. This design improves the flatness of the mirror; however, flatness would be improved further by placing the hinge at a lower level than the mirror, as discussed below.

A 2nd generation TI device is described in U.S. Pat. No. 5,583,688. A 2nd generation TI device is one in which the torsion hinge is at a different level than the reflective mirror. As described more fully in U.S. Pat. No. 5,583,688, the mirror is supported by a mirror support post, which is attached to the torsion hinge by a yoke. In U.S. Pat. No. 5,583,688, the mirrors are actuated by electrostatic forces between the mirror and address electrodes. The device is designed such that the mirror edge do not touch the address electrodes. Instead, the yoke edge touches the yoke landing site. In this design, the mirror is expected to remain flat during operation. The fill factor is relatively high because the CMOS circuits and torsion hinges are hidden under the mirror.

FIG. 2 of U.S. Pat. No. 5,583,688 shows that the mirror support post forms a rectangular recess in the mirror surface. This arises because the metallic mirror layer and mirror support post are formed by sputter deposition on a sacrificial layer that has had a via formed in it. It can be understood that the rectangular recesses are a source of scattering and diffraction.

The problem of the diffraction from the mirror support post (also called spacervia) is discussed in Dewald et al, "Advances in contrast enhancement for DLP projection displays," Journal of the SID, vol. 11/1, pp. 177–181 (2003). The projection of the propagation vector of the incident light beam on the substrate plane is called the illumination axis. In an earlier design, the rectangular edges of the spacervia were placed parallel and perpendicular to the illumination axis. In the earlier design, the dimensions of the spacervia were approximately 4 microns by 3 microns. In an improved design, called small rotated via (SRV), the dimensions of the spacervia were reduced to 2 microns by 3 microns. The area of the spacervia was reduced by 50%. Furthermore, the spacervia was rotated by 45 degrees relative to earlier designs, such that no rectangular edge of the spacervia was perpendicular to the illumination axis. As a result of these improvements, contrast increased by 50%.

The problem of diffraction effects is discussed in U.S. Pat. No. 6,469,821. It is shown that modified mirror designs are preferable. An improved mirror has 2 sides that are straight and parallel to the illumination axis. Instead of 2 additional sides that are perpendicular to the illumination axis, a modified mirror provides a leading jagged edge and a trailing jagged edge, such that no side is perpendicular to the illumination axis. If the spacervia edges are also not perpendicular to the illumination axis, then no edge of the mirror is perpendicular, and as a result, diffraction is reduced. Furthermore, it is shown that the overall size and cost of the display can be reduced by placing the light source relative to the micromirror array such that the illumination axis is parallel to 2 sides of the rectangular array and perpendicular to the remaining 2 sides of the rectangular array. Despite these improvements, the limitation of U.S. Pat. No. 6,469,821 is that it does not disclose how to obtain an optically flat mirror, i.e. one that eliminates diffraction effects from the spacervia. Furthermore, the device architecture that is described in U.S. Pat. No. 6,469,821 is one in which the mirrors are fabricated on top of CMOS circuits. There are additional problems associated with this architecture as discussed below.

Micromirrors that are described in U.S. Pat. No. 4,662,746 and U.S. Pat. No. 5,583,688 are fabricated on top of CMOS circuits. There may be manufacturing problems associated with the fabrication of micromirrors on top of CMOS circuits. This issue is discussed in U.S. Pat. No. 5,216,537. In this patent, it is discussed that the surface of the CMOS chip has certain manufacturing artifacts, namely aluminum hillocks, pinholes, nonplanar surfaces, and steep sidewalls in the protective oxide at edges of aluminum leads. In response to these problems, U.S. Pat. No. 5,216,537 discloses an improved architecture in which an air gap is provided between the top surface of the CMOS chip and the mirror addressing electrodes. A further advantage of this approach is that because of the low dielectric constant of air, parasitic coupling between the CMOS and the micromirror is reduced.

The placement of CMOS circuits directly under the micromirrors is also responsible for problems of photosensitivity. As discussed in U.S. Pat. No. 6,344,672, it was found that the CMOS memory cells are unstable in a high-intensity light environment. The patent provided an active collector region in which photogenerated carriers could recombine before reaching the addressing electrode.

Reflectivity, Inc. (Sunnyvale, Calif.) is also known to be developing micromirror devices. As disclosed in U.S. Pat. No. 5,835,256, the aforementioned problems associated with placing CMOS and micromirrors on the same substrate are solved by placing the micromirrors and CMOS on different substrates. In other words, a hinge and a micromirror are fabricated on an optically transparent substrate, such that the optically reflective surface of the micromirror is proximate the optically transparent substrate. Addressing circuits including mirror addressing electrodes are fabricated on a 2nd substrate (typically silicon) and the 2 substrates are bonded together with a predetermined gap between the micromirror and the addressing electrodes.

In order to reduce scattering by non-planar surfaces and increase the fill factor, it was necessary to provide a light shield on the optically transparent substrate in the hinge areas. In an improved device according to U.S. Pat. No. 6,529,310, the hinges are placed on the side of the mirror opposite to the side that is proximate the optically transparent substrate.

However, another difficulty with the architecture of U.S. Pat. No. 5,835,256 is that the gap between the mirror and mirror addressing electrodes is difficult to control. Since the actuation force is superlinearly dependent on this gap, it is imperative to achieve uniform gap over the entire array to obtain uniform performance characteristics. As discussed in US 2003/0134449, 2nd and higher order adjustments in the gap may be needed in the manufacturing process. Such adjustments make the manufacturing process more complicated. It would be preferable to have a device architecture in which the mirror address electrodes and mirrors are disposed on the same substrate.

U.S. Pat. No. 6,523,961 also discusses the problem of mirror design for reduced diffraction. Improved mirrors are non-rectangular. Numerous non-rectangular mirrors are proposed. All of the preferred mirrors are characterized by having at least 2 sides that are parallel to the illumination axis and 2 other sides that are non-perpendicular to the illumination axis. Furthermore, it shown that the overall size and cost of the display can be reduced by placing the light source relative to the micromirror array such that the illumination axis is parallel to 2 sides of the rectangular array and perpendicular to the remaining 2 sides of the rectangular array.

U.S. Pat. No. 6,523,961 describes a potential problem with certain mirror designs, when used as pixels in a spatial light modulator. For example, if an array of square mirrors were placed at a 45 degree angle relative to the SLM's x-y grid, twice as many row or column wires to the pixel controller cells would be required compared to the case where the array were placed at a 0 degree angle relative to the x-y grid. However, this is a potential difficulty with electrical connections to the array and is not directly related to the fabrication of micromirrors.

Despite these improvements, the limitation of U.S. Pat. No. 6,523,961 is that the preferred embodiments are illustrated with respect to a device architecture in which the addressing electrodes and micromirrors are disposed on separate substrates. As discussed above, this architecture causes complications in the manufacturing process, since the gap between the mirror and the electrode must be precisely and accurately controlled within an array.

U.S. Pat. No. 5,631,782 discloses an improvement to TI's 2nd generation micromirror device. It is discussed that conventional spacervias on the mirror surface are undesirable because of diffraction effects. It would be possible to cover the spacervia by sputtering sufficiently thick films of mirror material. However, a heavier mirror requires a higher resonant reset frequency. Reset efficiency drops off significantly with increasing reset frequency, because of frequency dependent damping effects. Therefore, it is desirable to keep the mirror as light as possible. U.S. Pat. No. 5,631,782 describes a mirror support pillar in which the top of the pillar is covered and closed. Since there is no hole, this is called a pillar instead of a spacervia. The support pillar is fabricated as follows. The pillar material may be a photoresist or a dielectric such as silicon oxide, silicon nitride, or silicon oxynitride. The pillar material is deposited on the underlying substrate, and is patterned into a pillar. A metal layer is then deposited. The metal covers the pillar as well as the surrounding area. This metal layer forms the sheath of the pillar. A photoresist layer sacrificial layer is formed by spin-coating. The photoresist on the top side of the pillar can be removed by plasma etching. The etching process at the top of the pillar essentially stops when the metal layer is exposed. However, the plasma etch also etches elsewhere else on the photoresist spacer layer, and therefore a mirror layer that is subsequently deposited on top of the spacer layer is not expected to be flat. Therefore, a limitation of U.S. Pat. No. 5,631,782 is that although it provides a method to eliminate the diffraction due to spacervias, a flat mirror cannot be made since the underlying spacer layer is not flat.

It is widely known that multilayer dielectric mirrors offer superior reflectivity compared to metallic mirrors. The use of multilayer dielectric mirrors has been well documented in the fabrication of Fabry-Perot etalons and lasers for example. In the case of electromechanical micromirrors, U.S. Pat. No. 6,538,800 discloses that a 96 nm thick layer of silicon dioxide (n=1.46) on top of a 68 nm thick layer of silicon nitride (n=2.0) will enhance the reflectivity of an aluminum layer from 92% to over 95%. In addition to improving the optical performance of the micromirror, a higher reflectivity is preferred because there is less heat generated in the micromirror array from the incident light.

U.S. Pat. No. 6,538,800 also discusses the use of amorphous silicon as a sacrificial layer. It is shown that amorphous silicon can be deposited for this purpose by LPCVD in a quartz tube of a Tylan furnace. It is also shown that a xenon difluoride etch process can be used to etch amorphous silicon with a selectivity of 100 to 1. Therefore, amorphous silicon can be used successfully as a sacrificial layer in addition to photoresists, silicon oxide, silicon nitride, and silicon oxynitride.

SUMMARY OF THE INVENTION

The present invention provides arrays of micromirror devices and fabrication methods for said arrays that overcome some of the limitations of the prior art. According to the present invention, an array of electromechanical micromirror devices comprises a device substrate with a 1st surface and a 2nd surface, control circuitry disposed on said 1st surface, and a plurality of micromirrors disposed on said 2nd surface. The arrays may be 1-dimensional (linear) or 2-dimensional and may be used as a spatial light modulators (SLMs). According to the present invention, methods of fabricating micromirror arrays generally involve providing a device substrate with a 1st surface and a 2nd surface, fabricating control circuitry on the 1st surface, and fabricating micromirrors on the 2nd surface. Each micromirror comprises a reflective surface that is substantially optically flat, with neither recesses nor protrusions. In a preferred embodiment, control circuits are fabricated using CMOS technology. In another preferred embodiment, the control circuits on the 1st surface are protected by a protective layer during the fabrication of micromirrors on the 2nd surface. In yet another preferred embodiment, the device substrate is a silicon-on-insulator (SOI) substrate. Optically flat micromirrors are obtained by depositing a sacrificial layer, planarizing said sacrificial layer, and depositing the micromirror layer. A preferred planarization method is chemical mechanical polishing (CMP).

A 1st advantage of the present invention is that it provides improved dielectric isolation between the control circuit and the micromirror. A 2nd advantage of the present invention is that provides improved optical isolation of the control circuit area. This is particularly advantageous when the micromirror array is used as a spatial light modulator (SLM) and the 1st surface (the micromirror side) is exposed to high intensity radiation. A 3rd advantage of the present invention is that it provides improved manufacturing yields because the control circuit manufacturing processes and micromirror manufacturing processes can be substantially isolated from each other. In other words, manufacturing artifacts arising from the control circuit process will not damage the micromirror because the micromirror is not built on top of the control circuit. A 4th advantage of the present invention is that the micromirrors are substantially flat, with no recesses or protrusions on its surface. These and other advantages of the present invention will become apparent from the detailed description and the claims below.

BRIEF DESCRIPTION OF THE FIGURES

FIG. 5A is a schematic plan view of a micromirror device in accordance with a 3rd embodiment of the present invention.

FIG. 5B is a schematic cross sectional view along line e-f of FIG. 5A.

FIGS. 8A through 8M are cross sectional views illustrating the fabrication steps on a 2nd device substrate surface, in accordance with a 4th embodiment of the present invention.

DETAILED DESCRIPTION OF THE INVENTION

Figure 1:
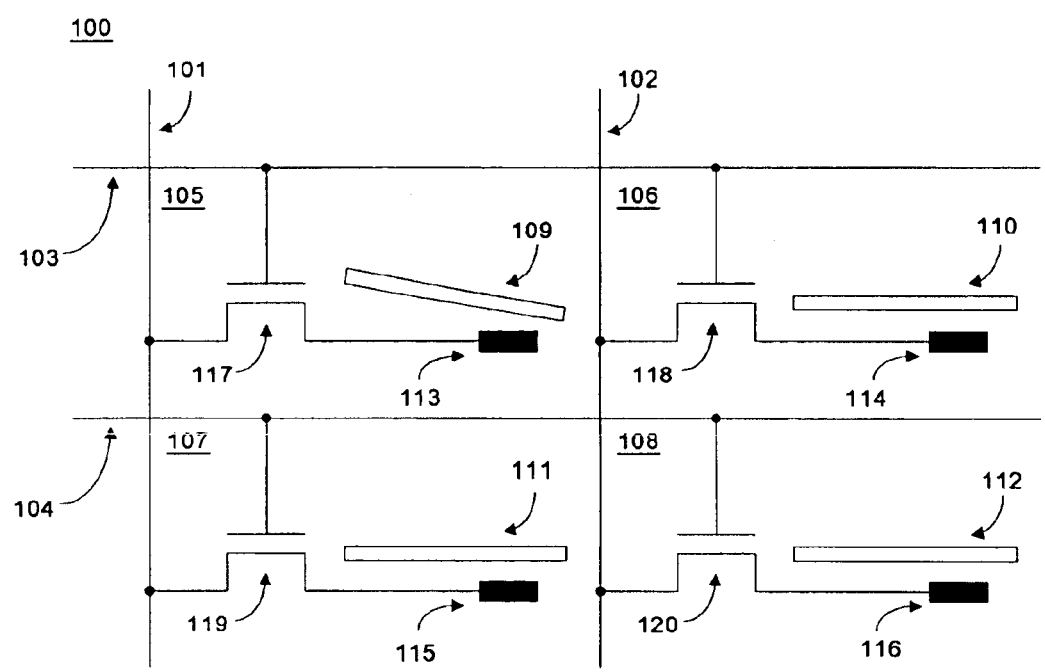
FIG. 1 is a schematic diagram of a 4-pixel array of micromirror devices, comprising control circuits, addressing electrodes, and micromirrors.

The present invention relates to electromechanical micromirror devices and arrays of such devices. Shown schematically in FIG. 1 is an array 100 comprising vertical data lines (101 and 102) and horizontal addressing lines (103 and 104), with each intersection of these data and addressing lines forming an electromechanical micromirror device (105, 106, 107, and 108). Each micromirror device comprises a micromirror (109, 110, 111, and 112), an addressing electrode (113, 114, 115, and 116), and an NMOS transistor (117, 118, 119, and 120). Micromirror 109 is shown to be in a deflected state while the other micromirrors are in their undeflected states. A possible scheme for addressing the micromirrors is as follows: The micromirrors (109, 110, 111, and 112) are electrically connected to ground. The deflection of a micromirror is determined by the bias voltage between the micromirror and its addressing electrode. The desired bias voltage is set by the voltages on the vertical data lines (101 and 102). The NMOS transistors are turned on by sending a low-high-low pulse on the addressing lines (103 and 104), which results in the bias voltages being stored between the micromirrors and addressing electrodes.

While array 100 (FIG. 1) has been shown to consist of 4 micromirror devices, an array may typically consist of greater than 60,000 micromirror devices and may be used as a spatial light modulator (SLM). Furthermore, while FIG. 1 shows a plurality of micromirror devices disposed in a 2-dimensional array, 1-dimensional (linear) array are also possible.

The circuitry as shown in FIG. 1 comprises the following:
1) micromirrors;
2) micromirror addressing electrodes; and
3) control circuitry.

In the particular case of FIG. 1, control circuitry consists of the vertical data lines (101 and 102), horizontal addressing lines (103 and 104), NMOS transistors (117, 118, 119, and 120), and electrical connections among them. In general, control circuitry is understood to mean any circuitry that is provided to control the application of bias voltages between a micromirror and its addressing electrode. As shown in FIG. 1, the control circuitry comprised NMOS transistors. However, it should be understood that the control circuitry could comprise other types of circuits, including CMOS circuits, PMOS circuits, bipolar transistor circuits, BICMOS circuits, DMOS circuits, HEMT circuits, amorphous silicon thin film transistor circuits, polysilicon thin film transistor circuits, SiGe transistor circuits, SiC transistor circuits, GaN transistor circuits, GaAs transistor circuits, InP transistor circuits, CdSe transistor circuits, organic transistor circuits, and conjugated polymer transistor circuits.

Figure 2:
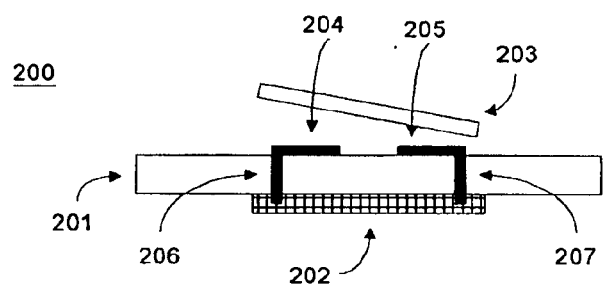
FIG. 2 is a schematic cross sectional view of a micromirror device in accordance with the present invention.

Some of the important concepts of the present invention are illustrated schematically in FIG. 2. A device substrate 201 has a bottom surface on which control circuitry 202 is fabricated. Micromirror 203 and addressing electrodes 204 and 205 are fabricated on the top surface of substrate 201. For simplicity, support structures for supporting micromirror 203 are not shown. Electrical connections between the addressing electrodes (203 and 204) and control circuitry 202 are provided by electrical routing lines 206 and 207. The electrical routing lines 206 and 207 may be in the form of vias in the device substrate 201 with metallization in these vias. The device substrate may be selected from among the following: silicon-on-insulator (SOI), silicon, polycrystalline silicon, glass, plastic, ceramic, germanium, SiGe, SiC, sapphire, quartz, GaAs, and InP. In general, the choice of device substrate should be consistent with the choice of control circuit technology. For example, a silicon-on-insulator substrate may be suitable for CMOS circuits, and a glass substrate may be suitable for amorphous silicon thin film transistor circuits.

Figure 3A:
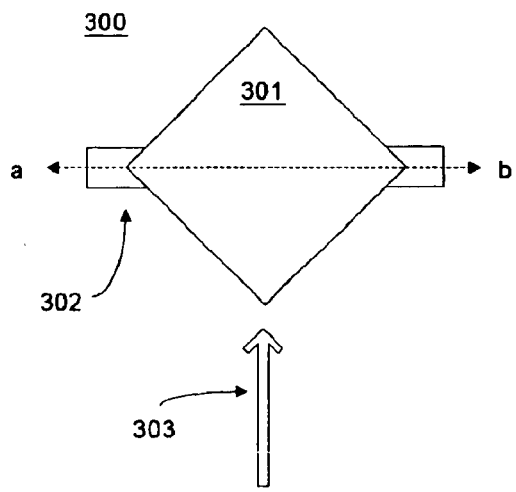
FIG. 3A is a schematic plan view of a micromirror device in accordance with a 1st embodiment of the present invention.
Figure 3B:
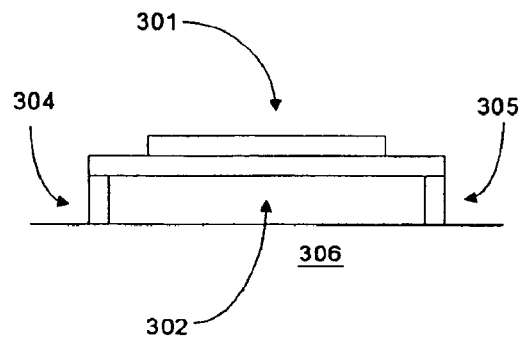
FIG. 3B is a schematic cross sectional view along line a-b of FIG. 3A.

As discussed with reference to FIG. 1, a micromirror device comprises a control circuitry, a micromirror, and addressing electrodes. FIG. 3A is a schematic plan view of a portion of a micromirror device 300 in accordance with a 1st embodiment of the present invention. Micromirror 301 is shown with its reflective side facing towards the reader. The reflective side of micromirror 301 is substantially planar, with neither recessions nor protrusions. Micromirror 301 is supported by a torsion hinge 302. In the case that micromirror portion 300 is disposed in an array for a spatial light modulator (SLM), arrow 303 indicates the projection of the incident light propagation direction on the device substrate plane. Note that micromirror 301 has 4 edges and no edge is perpendicular to arrow 303. FIG. 3B is a schematic cross sectional view along line a-b through torsion hinge 302. Micromirror 301 and torsion hinge 302 are supported by support structures 304 and 305, which are disposed on device substrate 306. Since the micromirror deflects by torsion, the axis of rotation of the micromirror is approximately perpendicular to arrow 303.

Figure 4A:
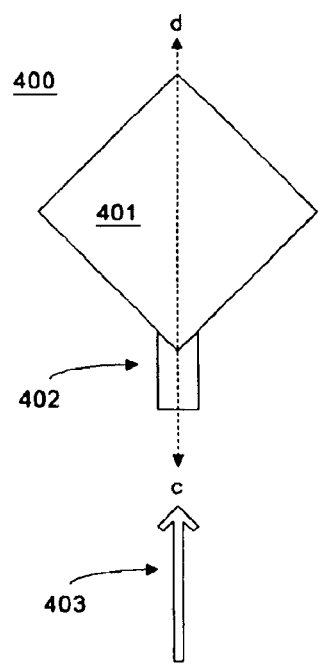
FIG. 4A is a schematic plan view of a micromirror device in accordance with a 2nd embodiment of the present invention.
Figure 4B:
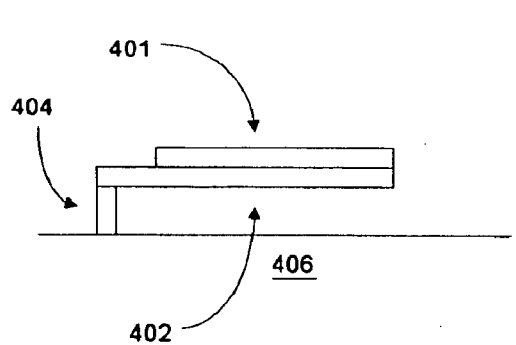
FIG. 4B is a schematic cross sectional view along line c-d of FIG. 4A.

FIG. 4A is a schematic plan view of a portion of a micromirror device 400 in accordance with a 2nd embodiment of the present invention. Micromirror 401 is shown with its reflective side facing towards the reader. The reflective side of micromirror 401 is substantially planar, with neither recessions nor protrusions. Micromirror 401 is supported by a beam 402. In the case that micromirror device 400 is disposed in an array for a spatial light modulator (SLM), arrow 403 indicates the projection of the incident light propagation direction on the device substrate plane. Note that micromirror 401 has 4 edges and no edge is perpendicular to arrow 403. FIG. 4B is a schematic cross sectional view along line c-d through beam 402. Beam 402 is supported by support structure 404, which is disposed on device substrate 406. In contrast to micromirror 301 (FIGS. 3A and 3B), the axis of rotation of micromirror 401 is approximately parallel to arrow 403.

FIG. 5A is a schematic plan view of a portion of a micromirror device 500 in accordance with a 3rd embodiment of the present invention. Micromirror 501 is shown with its reflective side facing towards the reader. The reflective side of micromirror 501 is substantially planar, with neither recessions nor protrusions. In the case that micromirror device 500 is disposed in an array for a spatial light modulator (SLM), arrow 503 indicates the projection of the incident light propagation direction on the device substrate plane. FIG. 5B is a schematic cross sectional view along line e-f. Micromirror 501 is supported by a support structure 504, which is disposed on device substrate 506. The axis of rotation of micromirror 501 is approximately parallel to arrow 503.

An important difference between between micromirror device 400 (FIGS. 4A and 4B) and micromirror device 500 (FIGS. 5A and 5B) is that in device 400, there is a beam 402 which supports the micromirror 401 on the support structure 404, whereas in device 500, the micromirror is positioned directly on support structure 504. Therefore, in FIG. 5A, the top side 502 of support structure 504 is visible in the plan view.

Figure 6A:
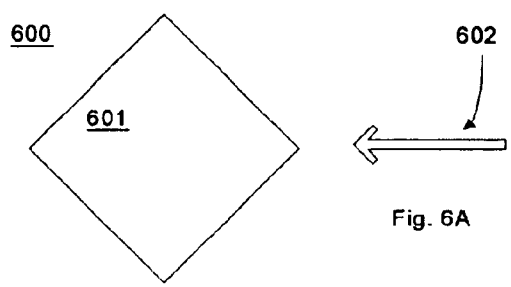
FIGS. 6A through 6D are schematic plan views of a micromirror device according to a 4th embodiment of the present invention, at varying levels of elevation.

FIGS. 6A through 6D are schematic plan views of a micromirror device 600 accoding to a 4th embodiment of the present invention, at varying levels of elevation. FIG. 6A shows the reflective side (top side) of a micromirror 601. In the case that micromirror device 600 is disposed in an array for a spatial light modulator (SLM), arrow 602 indicates the projection of the incident light propagation vector on the device substrate plane. Arrow 602 is not perpendicular to any of the 4 sides of micromirror 601. Arrow 602 is shown to be approximately 45 degrees from the leading edges of micromirror 601. The reflective side of micromirror 601 is is substantially flat, with neither recesses nor protrusions. As a result, there are no diffraction effects that would be caused by recesses or protrusions in the micromirror.

Figure 6B:
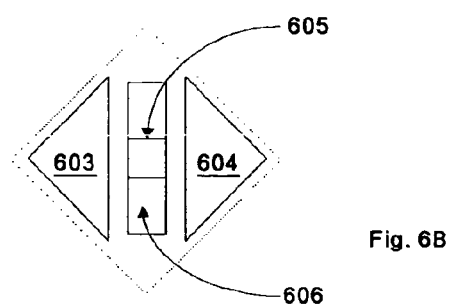
Figure 6C:
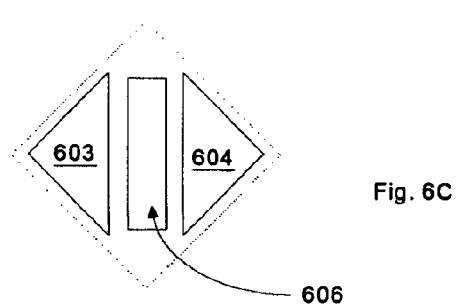

FIG. 6B shows a plan view that is analogous to FIG. 6A except that micromirror 601 has been removed. Addressing electrodes 603 and 604, micromirror support structure 605, and torsion hinge 606 are visible. Torsion hinge 606 supports micromirror support structure 605. Addressing electrodes 603 and 604 are electrically connected to control circuitry which is not shown. Micromirror 601 is actuated by electrostatic forces between it and one or both of the addressing electrodes 603 and 604. FIG. 6C shows the result of removing the mirror support structure 605.

Figure 6D:
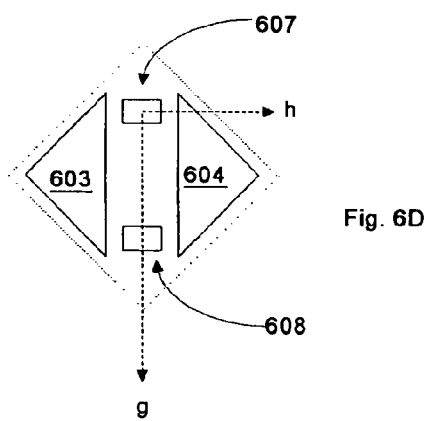

FIG. 6D shows the result of removing torsion hinge 606. Torsion hinge support structures 607 and 605 are shown. FIGS. 7A through 7D and 8A through 8M show a fabrication sequence of a micromirror device using a cross sectional view along the line g-h. In many cases, the micromirror device would be fabricated in an array for use as a spatial light modulator. Therefore, although FIGS. 7A through 7D and 8A through 8M illustrate the fabrication of a single micromirror device, it should be understood that the teachings can be extended to the fabrication of an array of micromirror devices.

Figure 7A:
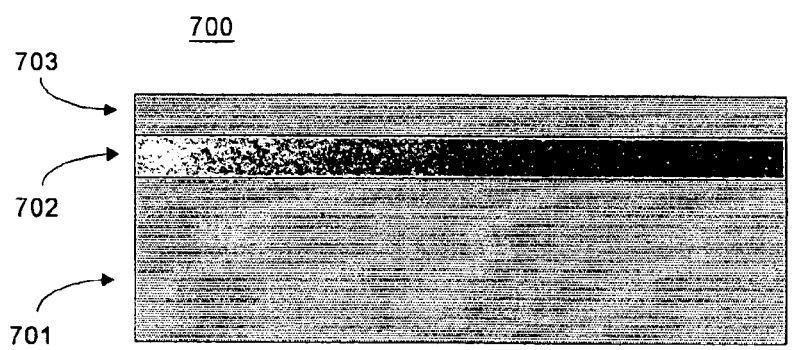
FIGS. 7A through 7D are cross sectional views illustrating the fabrication steps on a 1st device substrate surface, in accordance with a 4th embodiment of the present invention.

FIGS. 7A through 7D illustrate a fabrication sequence on the control circuitry side. FIG. 7A shows a silicon-on-insulator (SOI) substrate 700 comprising an epitaxial top silicon layer 703 with a thickness typically ranging from 50 nm to 600 nm, an intermediate insulator layer 702 with a thickness typically ranging from 50 nm to 2 $\mu$m, and a bottom silicon layer 701 with a thickness of around 775 $\mu$m. One of the advantages of SOI over silicon substrates is the improved dielectric isolation. In the case of the present invention, the SOI substrate is used to improve the dielectric isolation of the control circuitry and micromirror portion.

Figure 7B:
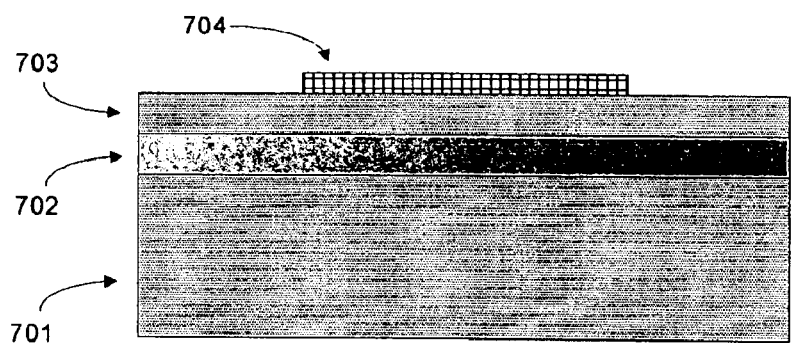

FIG. 7B shows the formation of control circuitry 704 on epitaxial layer 703 of the SOI substrate 700. In general, any integrated circuit technology can be considered for fabricating the control circuitry. For example, CMOS circuitry may be used. However, for applications requiring high frequency or high voltages, BiCMOS or DMOS circuitry may be used.

Figure 7C:
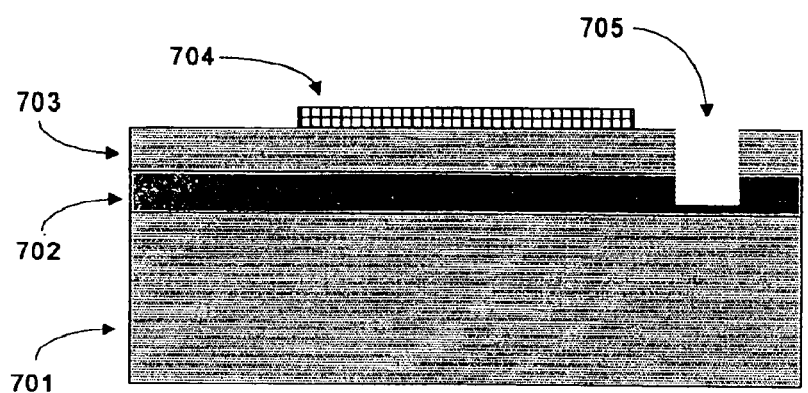
Figure 7D:
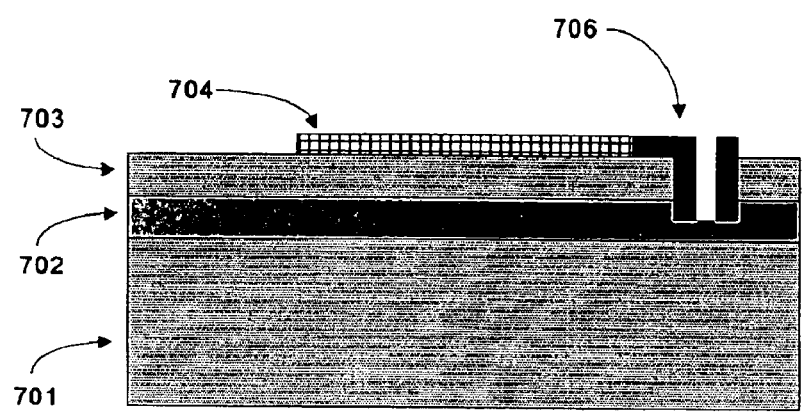

FIG. 7C shows the step of forming a trench 705 through the top epitaxial silicon layer 703 and insulator layer 702, using standard patterning and an anisotropic etch. The anisotropic etch is stopped before the trench 705 reaches the bottom silicon layer 701. This is followed by a metal deposition and patterning step (FIG. 7D) which forms an electrical connection 706 between the control circuitry and the trench. It should be understood that this metal could be any metal that is used in semiconductor fabrication, such as Al alloy, and methods of metal deposition include sputtering, thermal evaporation, and CVD.

At this point the process steps on the control circuitry side are complete. It may be preferable to form a protective layer on the control circuitry side. FIGS. 8A through 8M illustrate a fabrication sequence on the micromirror side. The control circuitry side is mounted on a carrier to securely hold the substrate for the subsequent step (FIG. 8A) of backgrinding and chemical mechanical polishing (CMP) of the back silicon layer 701 to expose the intermediate insulator layer 702.

As shown in FIG. 8B, insulator layer 702 is pattered to form a trench 801, thereby completing the via that had been started in the step of FIG. 7C. Another metallization (deposition and patterning) step (FIG. 8C) forms addressing electrodes 802 that are electrically connected, through via 801, to control circuitry 704.

Figure 8E:
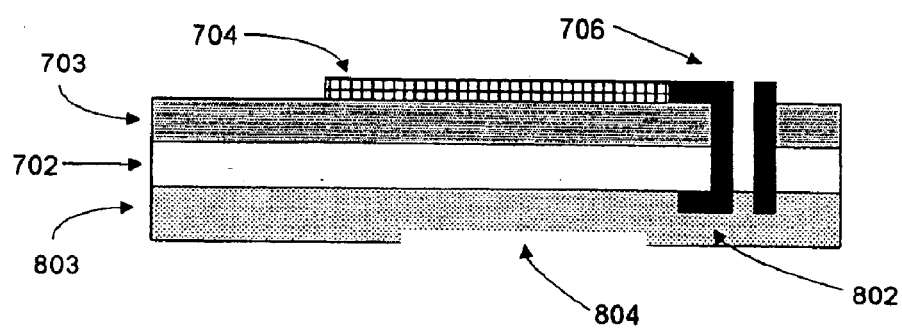
Figure 8F:
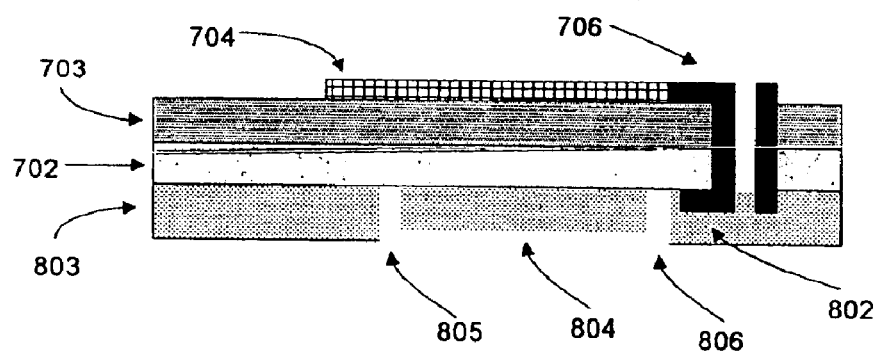

After the formation of the addressing electrodes 802, the torsion hinge and its support structures are formed. An embodiment of this process is illustrated in FIGS. 8D through 8H. An amorphous silicon sacrificial layer 803 is deposited by LPCVD (FIG. 8D). Other suitable methods of depositing amorphous silicon are PECVD, catalytic CVD (also known as hot wire CVD), and sputtering. As discussed in the Background Art section, xenon difluoride can be used to etch amorphous silicon with a selectivity of 100 to 1. Other possible sacrificial layers are photoresists, silicon oxide, silicon nitride, and silicon oxynitride. As shown in FIG. 8E, a photolithographic patterning and anisotropic etching step is carried out to form a recess 804 where the torsion hinge will be formed. Then, another photolithographic patterning and anisotropic etching step (FIG. 8F) is carried out to form holes 805 and 806 where the torsion hinge support structures will be formed. The holes 805 and 806 for the torsion hinge support structures reach the intermediate insulator layer.

Figure 8G:
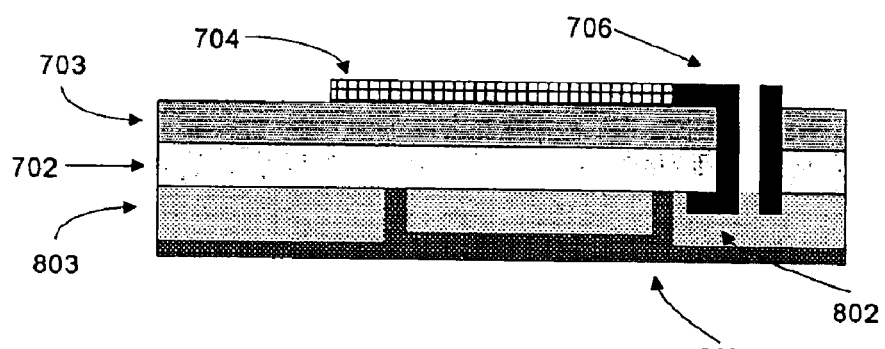
Figure 8H:
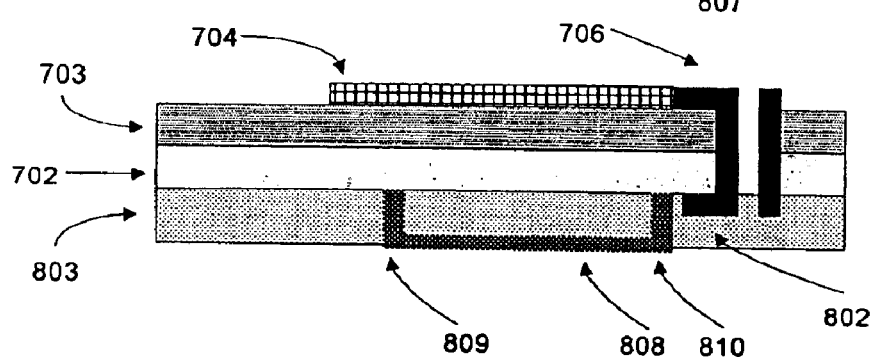

As shown in FIG. 8G, a layer 807 of structural material is deposited. For example, the structural material may be an Al alloy comprising 0.2% Ti, 1% Si, and the remainder Al. A preferred method of depositing this Al alloy is sputter deposition. A metal is chosen for the structural material because the micromirror is typically held at ground potential. As shown in FIG. 8H, structural material layer 807 is patterned to form a torsion hinge 808 and torsion hinge support structures 809 and 810. Torsion hinge 808 and torsion hinge support structures 809 and 810 are at least partially embedded in sacrificial layer 803.

Figure 8I:
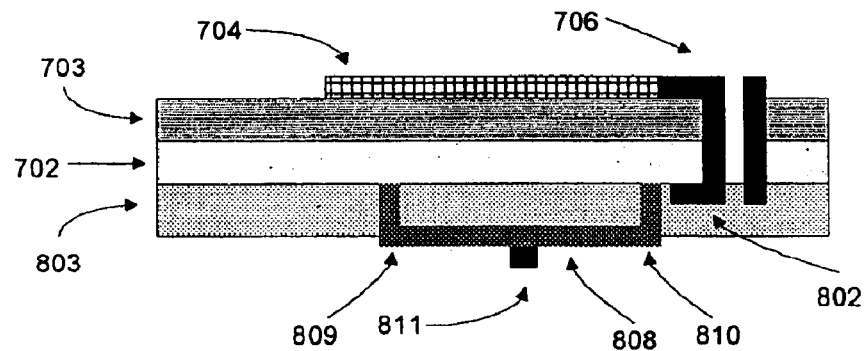
Figure 8J:
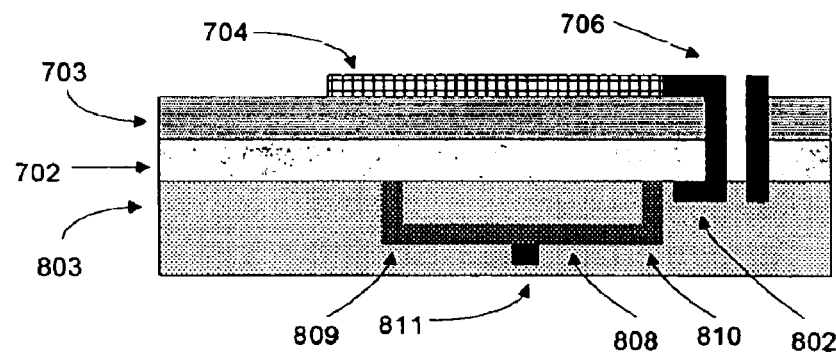
Figure 8K:
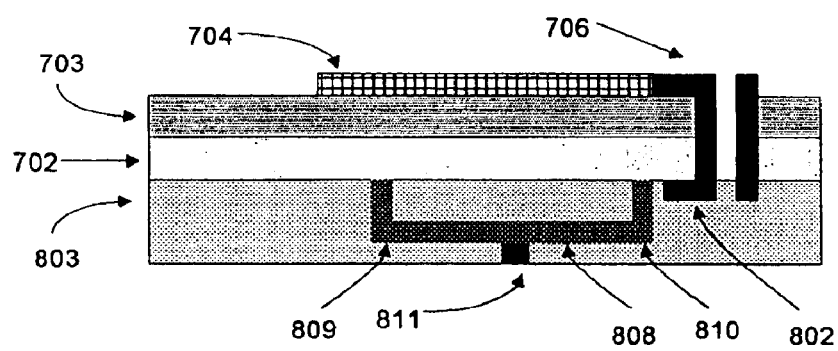

A micromirror support structure is placed between the torsion beam and the micromirror. As shown in FIG. 8I, a metal layer is deposited and then patterned to provide a micromirror support structure 811 on torsion beam 808. The metal may be an Al alloy comprising 0.2% Ti, 1% Si, and the remainder Al. A preferred method of depositing this Al alloy is sputter deposition. Another layer of sacrificial amorphous silicon is deposited (FIG. 8J) such that the micromirror support structure 811 is fully covered by sacrificial layer 803. A chemical mechanical polishing (CMP) process is carried out to planarize the surface such that the following requirements are satisfied:

1) the top of the micromirror support structure 811 is exposed and planar;
2) the sacrificial layer 803 is planar; and
3) the top of the micromirror support structure 811 and the top of the sacrificial layer 803 are at the same level.

In this description, top is understood to mean bottom on the drawing page. The result of the planarization step is shown schematically in FIG. 8K.

Figure 8L:
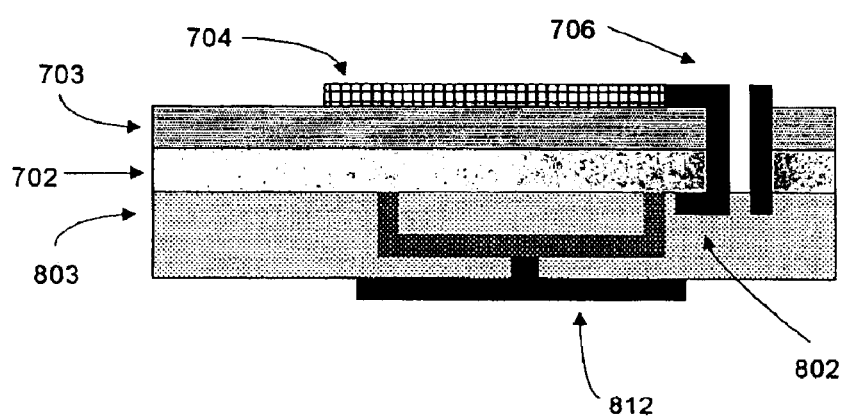
Figure 8M:
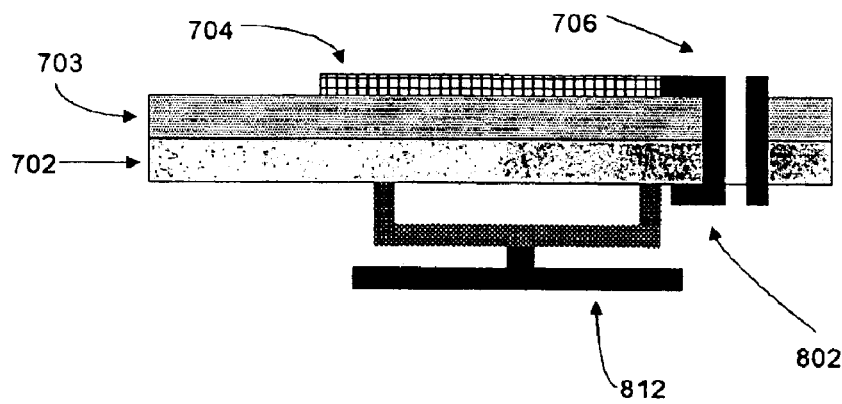

A metallic layer is deposited and patterned to form a micromirror 812 as shown in FIG. 8L. The metal may be an Al alloy comprising 0.2% Ti, 1% Si, and the remainder Al. A preferred method of depositing this Al alloy is sputter deposition. The micromirror 812 is connected to the micromirror support structure 811. A xenon difluoride etch is carried out to remove the amorphous silicon sacrificial layer (FIG. 8M).

In the foregoing discussion the preferred micromirror comprised a metallic coating. However, it is also possible to construct a micromirror out of multiple alternating layers of higher refractive index and lower refractive index dielectrics. This may be accomplished by using silicon oxide and silicon nitride. Therefore, if an Al mirror has a reflectivity of 92%, the reflectivity can be increased to over 95% by first depositing 68 nm of silicon nitride (n=2.0) and then depositing 96 nm of silicon dioxide (n=1.46).

In the foregoing discussion of FIGS. 8G to 8M, all of the structural members (torsion hinge, torsion hinge support structures, micromirror, micromirror support structures) were metallic. Alternatively, it is possible to use a dielectric (e.g. hardened photoresist, silicon oxide, silicon nitride, silicon oxynitride) that has been covered with a metallic sheath as a structural member, as described more fully in U.S. Pat. No. 5,631,782.

Figure 9:
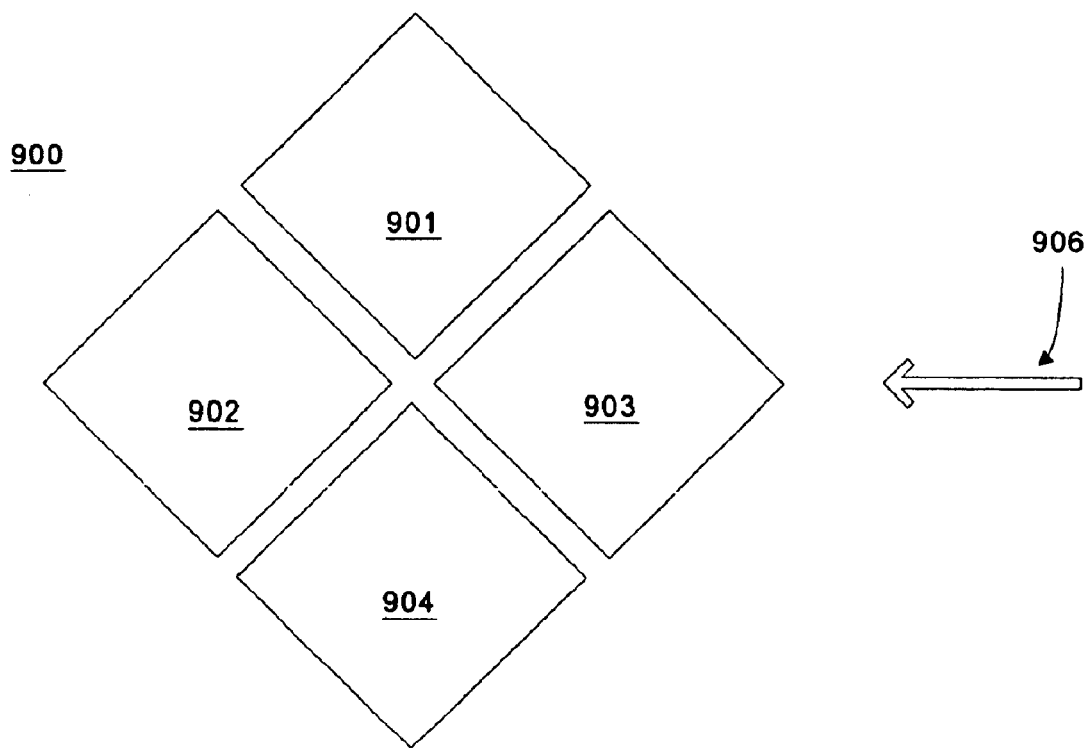
FIG. 9 is a schematic plan view illustrating a micromirror array of rectangular micromirrors according to a 5th embodiment of the present invention.
Figure 10:
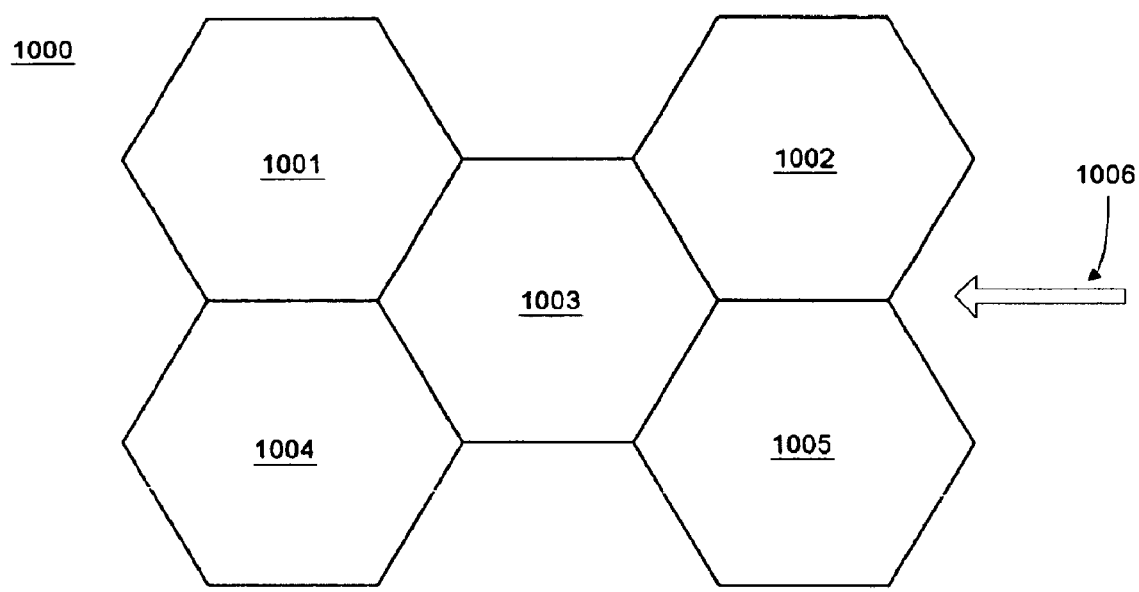
FIG. 10 is a schematic plan view illustrating an array of hexagonal micromirrors in accordance with a 6th embodiment of the present invention.

Typically, micromirror devices are incorporated into an array. FIG. 9 shows a 2-dimensional array 900 of rectangular micromirrors (901, 902, 903, and 904), according to a 5th embodiment of the present invention. Arrow 906 indicates the projection of the incident light propagation vector on the mirror plane (device substrate plane). The reflective side of the micromirror has no edges that are perpendicular to arrow 906. This is a configuration that reduces diffraction into the acceptance cone of the optical system. Another possible shape for a micromirror is a hexagon, shown being disposed in an array 1000 in FIG. 10, according to a 6th embodiment of the present invention. There are micromirrors 1001, 1002, 1003, 1004, and 1005. Arrow 1006 indicates the projection of the incident light propagation vector on the mirror plane (device substrate plane). The reflective side of the micromirrors has no edges that are perpendicular to arrow 1006.

Figure 11A:
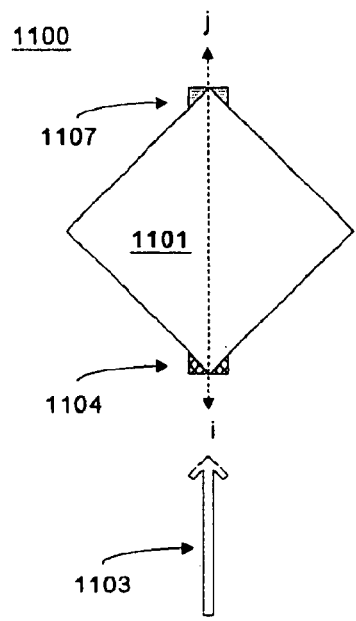
FIG. 11A is a schematic plan view of a micromirror device in accordance with a 7th embodiment of the present invention.
Figure 11B:
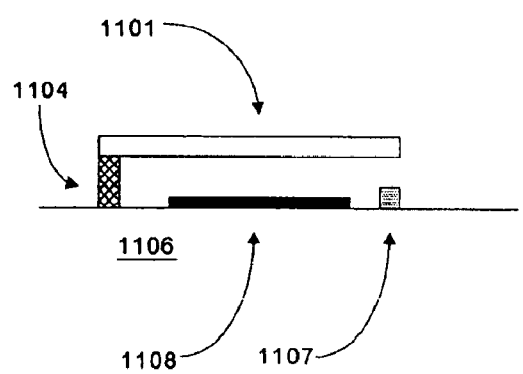
FIG. 11B is a schematic cross sectional view along line i-j of FIG. 11A.

A 7th embodiment of the present invention is explained with reference to FIGS. 11A and 11B. FIG. 11A is a schematic plane view of a micromirror device 1100, comprising a micromirror 1101 and a micromirror support structure 1104. Arrow 1103 indicates the projection of the incident light propagation vector on the micromirror plane (device substrate plane). The reflective side of the micromirror has no edges that are perpendicular to arrow 1103. The reflective side of micromirror 1101 is substantially planar, with neither recessions nor protrusions. FIG. 11B is a schematic cross sectional view along line id of FIG. 11A.

An addressing electrode 1108 is located under micromirror 1101 and on top of device substrate 1106. Furthermore, a stopper 1107 has been provided. The purpose of stopper 1107 is to prevent micromirror 1101 from contacting addressing electrode 1108 under deflection. This may cause an electrical short. Instead, micromirror 1101 contacts stopper 1107. In cases where a micromirror deflects in 2 directions from its undeflected state, it is possible to provide 2 stoppers with 1 stopper for each direction of deflection.

Figure 11C:
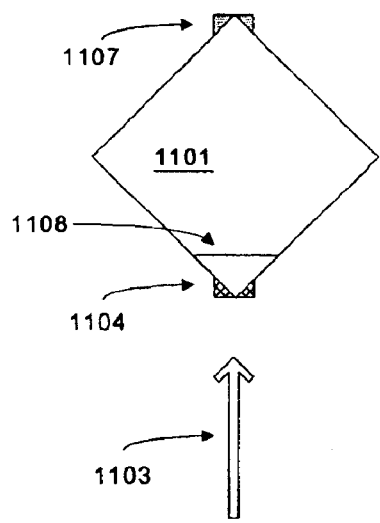
FIG. 11C is a schematic plan view of a micromirror device in accordance with an 8th embodiment of the present invention.

FIG. 11C illustrates a modification to micromirror device 1100 in accordance with an 8th embodiment of the present invention. FIG. 11C is a plan view of a micromirror device 1100 comprising a micromirror 1101, a support structure 1104, and a stopper 1107. In its undeflected state, the reflective side of micromirror 1101 has no edges that are perpendicular to arrow 1103. When the micromirror 1101 is actuated, the region 1108 of micromirror 1101 that is adjacent to support structure 1104 gets deflected. Therefore, an edge that is perpendicular to arrow 1103 may appear in region 1108. In order to reduce diffraction effects from this edge, it is possible to coat region 1108 with a light absorbing material. A preferred light absorbing material is a black dye.

I claim:

1. An array of electromechanical micromirror devices comprising a plurality of electromechanical micromirror devices disposed in a 1-dimensional or 2-dimensional array, comprising:
    a device substrate with a 1st surface and a 2nd surface;
    control circuitry disposed on said 1st surface of said substrate; and
    an array of micromirror sections disposed on said 2nd surface of said substrate,
    wherein each said micromirror section comprises:
        a micromirror whose reflective surface is substantially planar when said micromirror is in its undeflected state, with neither recesses nor protrusions; and
        at least 1 support structure for supporting said micromirror.

2. The array of claim 1, wherein said control circuitry is selected from the group consisting of: CMOS circuits, NMOS circuits, PMOS circuits, bipolar transistor circuits, BiCMOS circuits, DMOS circuits, HEMT circuits, amorphous silicon thin film transistor circuits, polysilicon thin film transistor circuits, SiGe transistor circuits, SiC transistor circuits, GaN transistor circuits, GaAs transistor circuits, InP transistor circuits, CdSe transistor circuits, organic transistor circuits, and conjugated polymer transistor circuits.

3. The array of claim 1, wherein said device substrate is selected from the group consisting of silicon-on-insulator (SOI), silicon, polycrystalline silicon, glass, plastic, ceramic, germanium, SiGe, SiC, sapphire, quartz, GaAs, and InP.

4. The array of claim 1, wherein each said micromirror section additionally comprises at least 1 addressing electrode for actuating said micromirror.

5. The array of claim 4, additionally comprising at least 1 electrically conductive routing line integral with said device substrate that connects said control circuitry to said at least 1 addressing electrode of at least 1 of said micromirror sections.

6. The array of claim 5, wherein said at least 1 electrically conductive routing line comprises a via through said substrate and a metallization in said via.

7. The array of claim 1, wherein said device substrate additionally comprises an insulating layer between said 1st surface and said 2nd surface.

8. The array of claim 1, wherein said micromirror is a metallic mirror.

9. The array of claim 1, wherein said micromirror is a multilayer dielectric mirror.

10. The array of claim 1, wherein the reflectivity of the reflective side of said micromirror is at least 80%.

11. The array of claim 10, wherein said reflectivity is at least 90%.

12. The array of claim 11, wherein said reflectivity is at least 95%.

13. The array of claim 1, wherein the reflective surface of said micromirror has no edges that are perpendicular to the projection of the incident light propagation vector onto the plane of said device substrate.

14. The array of claim 1, wherein the reflective surface of said micromirror, when said micromirror is in its undeflected or deflected states, has at least 1 edge that is greater than 60 degrees and less than 120 degrees from the projection of the incident light propagation vector onto the plane of said device substrate, and wherein said at least 1 edge is covered by a layer of light absorbing material.

15. The array of claim 1, wherein said micromirror is in the shape of a polygon.

16. The array of claim 15, wherein said polygon is selected from the group consisting of a rectangle and a hexagon.

17. The array of claim 1, wherein said micromirror section additionally comprises:
    a torsion hinge that is disposed to support said micromirror support structure; and
    a pair of support structures for said torsion hinge that supports said torsion hinge on said substrate.

18. The array of claim 1, wherein said micromirror section additionally comprises at least 1 stopping member that limits the rotation of said micromirror.

19. The array of claim 18, wherein said at least 1 stopping member comprises:
    a 1st stopping member that limits the rotation of said micromirror in a 1st direction; and
    a 2nd stopping member that limits the rotation of said micromirror in a direction opposite to said 1st direction.

20. A spatial light modulator (SLM) comprising an array according to claim 1.

21. A method of fabricating an array of electromechanical micromirror devices, comprising the steps of:
    providing a device substrate with a 1st surface and a 2nd surface;
    forming control circuitry on said 1st surface of said substrate; and
    forming a plurality of micromirror sections on said 2nd surface of said substrate, comprising the steps of:
        forming a plurality of support structures for supporting micromirrors; and
        forming a plurality of micromirrors such that each micromirror has a reflective surface that is substantially planar when said micromirror is in its undeflected state, with neither recesses nor protrusions.

22. The method of claim 21, wherein said step of forming control circuitry comprises a step of fabricating circuits selected from the group consisting of: CMOS circuits, NMOS circuits, PMOS circuits, bipolar transistor circuits, BiCMOS circuits, DMOS circuits, HEMT circuits, amorphous silicon thin film transistor circuits, polysilicon thin film transistor circuits, SiGe transistor circuits, SiC transistor circuits, GaN transistor circuits, GaAs transistor circuits, InP transistor circuits, CdSe transistor circuits, organic transistor circuits, and conjugated polymer transistor circuits.

23. The method of claim 21, wherein said device substrate is selected from the group consisting of silicon-on-insulator (SOI), silicon, polycrystalline silicon, glass, plastic, ceramic, germanium, SiGe, SiC, sapphire, quartz, GaAs, and InP.

24. The method of claim 21, wherein said step of forming said micromirror sections additionally comprises a step of forming a plurality of addressing electrodes for actuating said plurality of micromirrors.

25. The method of claim 24, additionally comprising a step of forming a plurality of electrically conductive routing lines integral with said device substrate that connects said control circuitry to said plurality of addressing electrodes.

26. The method of claim 25, wherein said step of forming said plurality of electrically conductive routing lines comprises the steps of:
   forming at least 1 via through said substrate; and
   forming a metallization in said at least 1 via.

27. The method of claim 21, wherein said device substrate additionally comprises an insulating layer disposed between said 1st surface and said 2nd surface.

28. The method of claim 21, wherein said step of forming micromirrors comprises a step of forming a reflective metallic coating.

29. The method of claim 21, wherein said step of forming micromirrors comprises the steps of forming a reflective multilayer dielectric coating.

30. The method of claim 21, wherein said step of forming micromirror sections comprises the steps of:
   forming said plurality of micromirror support structures such that it is embedded in a layer of sacrificial material;
   planarizing said sacrificial layer such that said sacrificial layer and the top of said micromirror support structures are substantially planar;
   depositing a micromirror material on said planar surface;
   patterning said micromirror material to form a plurality of micromirrors; and
   removing said sacrificial layer by an etching process.

31. The method of claim 30, wherein said sacrificial layer material is selected from the group consisting of photoresist polymer, silicon oxide, silicon nitride, silicon oxynitride, and amorphous silicon.

32. The method of claim 30, wherein said planarizing step comprises a chemical mechanical polishing (CMP) process.

33. The method of claim 21, wherein said step of forming a plurality of micromirrors comprises a step of:
   patterning each micromirror such that its reflective surface has no edges that are perpendicular to the projection of the incident light propagation vector onto the plane of said device substrate.

34. The method of claim 21, wherein said step of forming a plurality of micromirrors comprises the steps of:
   patterning each micromirror such that its reflective surface, when said micromirror is in its undeflected or deflected states, has at least 1 edge that is greater than 60 degrees and less than 120 degrees from the projection of the incident light propagation vector onto the plane of said device substrate; and
   covering said at least 1 edge with a layer of light absorbing material.

35. The method of claim 21, wherein each said micromirror is patterned to be in the shape of a polygon.

36. The method of claim 35, wherein said polygon is selected from the group consisting of a rectangle and a hexagon.

37. The method of claim 21, additionally comprising a step of forming a torsion hinge for supporting each said micromirror support structure, said step comprising:
   forming a plurality of support structures for supporting torsion hinges; and
   forming a plurality of torsion hinges.

38. The method of claim 21, additionally comprising the step of:
   forming at least 1 stopping member that limits the rotation of each said micromirror.

39. The method of claim 38, wherein said step of forming at least 1 stopping member comprises:
   forming a 1st stopping member that limits the rotation of each said micromirror in a 1st direction; and
   forming a 2nd stopping member that limits the rotation of each said micromirror in a direction opposite to said 1st direction.

40. A method of fabricating an array of electromechanical micromirror devices, comprising the steps of:
   providing a silicon-on-insulator substrate with an epitaxial top silicon layer, an insulator layer, and a bottom silicon layer;
   forming control circuitry on said epitaxial top silicon layer;
   removing said bottom silicon layer, thereby exposing the insulator layer; and
   forming a plurality of micromirror sections on said exposed insulator layer, comprising the steps of:
      forming a plurality of support structures for supporting micromirrors; and
      forming a plurality of micromirrors whose reflective surface is substantially optically flat when said micromirror is in its undeflected state, with neither recesses nor protrusions.

41. The method of claim 40, wherein said step of forming control circuitry comprises a step of fabricating circuits selected from the group consisting of: CMOS circuits, NMOS circuits, PMOS circuits, bipolar transistor circuits, BiCMOS circuits, and DMOS circuits.

42. The method of claim 40, wherein said step of removing said bottom silicon layer comprises backgrinding.

43. The method of claim 40, wherein said step of removing said bottom silicon layer comprises chemical mechanical polishing (CMP).

44. The method of claim 40, wherein said step of forming said micromirror section additionally comprises a step of forming a plurality of addressing electrodes for actuating said plurality of micromirrors.

45. The method of claim 44, additionally comprising a step of forming a plurality of electrically conductive routing lines integral with said device substrate that connects said control circuitry to said plurality of addressing electrodes.

46. The method of claim 45, wherein said step of forming said plurality of electrically conductive routing lines comprises the steps of:
   forming at least 1 via through said substrate; and
   forming a metallization in said at least 1 via.

47. The method of claim 40, wherein said step of forming micromirror sections comprises the steps of:
   forming said plurality of micromirror support structures such that it is embedded in a layer of sacrificial material;
   planarizing said sacrificial layer such that said sacrificial layer and the top of said micromirror support structures are substantially planar;
   depositing a micromirror material on said planar surface;
   patterning said micromirror material to form a plurality of micromirrors; and
   removing said sacrificial layer by an etching process.

48. The method of claim 47, wherein said planarizing step comprises the chemical mechanical polishing (CMP) process.

* * * * *